(12) United States Patent
Yagi et al.

(10) Patent No.: US 6,765,944 B2
(45) Date of Patent: Jul. 20, 2004

(54) SEMICONDUCTOR LASER DEVICE

(75) Inventors: Tetsuya Yagi, Tokyo (JP); Yasuaki Yoshida, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/307,365

(22) Filed: Dec. 2, 2002

(65) Prior Publication Data

US 2003/0231684 A1 Dec. 18, 2003

(30) Foreign Application Priority Data

May 30, 2002 (JP) ........................................ 2002-157114

(51) Int. Cl.$^7$ ................................................ H01S 5/22
(52) U.S. Cl. ...................................................... 372/46
(58) Field of Search .......................................... 372/46

(56) References Cited

U.S. PATENT DOCUMENTS

2002/0159494 A1 * 10/2002 Tojo et al. .................... 372/46

2003/0091082 A1 * 5/2003 Fukunaga .................... 372/45

OTHER PUBLICATIONS

Miyashita, M. et al.; "High–Power Operation of Low–Operating–Current 660nm Laser Diodes for DVD–RAM/RW", OECC/IOOC 2001 Conference Incorporating ACOFT, Jul. 2–Jul. 5, 2002.

* cited by examiner

Primary Examiner—James W. Davie
(74) Attorney, Agent, or Firm—Leydit, Voit & Mayer, Ltd.

(57) ABSTRACT

A semiconductor laser device includes a stacked structure. The stacked structure includes a first electrode, a substrate of a first conductivity type on the first electrode, a first cladding layer of the first conductivity type, an active layer, a second cladding layer of a second conductivity type opposite the first conductivity type, an insulating layer, and a second electrode. The second cladding layer includes at least first and second portions having thickness different from each other. The first portion is thicker than the second portion. The insulating layer is deposited on the second cladding layer but not on the first portion. The second electrode is electrically connected to the first portion. A product of a reciprocal of layer thickness and heat conductivity of the insulating layer is smaller than $4 \times 10^8$ W/(m$^2$K).

6 Claims, 9 Drawing Sheets

SEMICONDUCTOR LASER DEVICE

BACKGROUND OF THE INVENTION

1. Field of the Invention

The present invention relates to a semiconductor laser device and, more particularly, to a ridge waveguide type semiconductor laser device.

2. Description of the Background Art

There are semiconductor laser devices having various structures. In particular, it is noted that some semiconductor laser devices have a channel waveguide having a refractive index structure for confining light in an active layer in a horizontal direction parallel to the layer. For example, a ridge waveguide type semiconductor laser device is a channel waveguide type semiconductor laser device. The ridge waveguide type semiconductor laser device has a ridge portion (that is, projection portion) projected from the peripheral cladding layer such that current is injected into the ridge portion for laser oscillation.

The ridge waveguide type semiconductor laser device will be described below with reference to FIGS. 1 to 3. As shown in FIGS. 1 and 2, the semiconductor laser device 60 has a stacked structure including a first electrode 56a, an n-type GaAs substrate 51, an n-type AlGaInP first cladding layer 52, an active layer 53, a p-type AlGaInP second cladding layer 54, an insulating layer 55, a p-type GaAs contact layer 57, and a second electrode 56b. The active layer 53 has multiple quantum wells (hereinafter referred to as MQW) structure. The second cladding layer 54 has a projection portion 58 that projects. The insulating layer 55 covers the portion except for the top thereof, and it is made of a silicon nitride (SiN) layer having a layer thickness of 100 nm. The second electrode 56b is electrically connected to the top of the projection portion 58 of the second cladding layer 54 through the contact layer 57. The first and second electrodes 56a and 56b are made of a metal such as AuGe/Ni/Au and Ti/Au, respectively. In addition, a window region 59 is formed by diffusion of zinc atoms within the active layer 53, adjacent to a facet of the semiconductor laser device 60. A laser beam 62 is output to the outside through the end-face window region 59.

FIG. 3 shows optical output dependency of a far field pattern (hereinafter referred to as FFPx) in a direction parallel to a p-n junction plane of the conventional ridge waveguide type semiconductor laser device. As shown in FIG. 3, a half width of FFPx is increased as the optical output is increased. There is a relatively large difference of about 2° between half widths of FFPx at an output of 5 mW and at an output of 50 mW (hereinafter referred to as ΔFFPx). It is noted that the half width of FFPx at 50 mW is measured but FFPx at 50 mW isn't shown in the figure. When the optical output is changed, if ΔFFPx is large, optical design in an application device such as a DVD-R drive becomes disadvantageously complicated.

SUMMARY OF THE INVENTION

It is, therefore, an object of the present invention to provide a semiconductor laser device in which ΔFFPx is not changed largely even when optical output thereof is changed.

In accordance with one aspect of the present invention, there is a semiconductor laser device including a stacked structure. The stacked structure includes a first electrode, a substrate of first conduction type layered on the first electrode, a first cladding layer of the first conduction type, an active layer, a second cladding layer of second conduction type opposite to the first one, an insulating layer, and a second electrode. The second cladding layer is deposited on the active layer. The second cladding layer includes at least first and second portion having thickness different from each other. The first portion is thicker than the second portion. The first portion is referred to as projection portion. The insulating layer is deposited on the second cladding layer except for the first portion. The second electrode electrically is connected to the first portion of the second cladding layer, and is deposited on the insulating layer. In the insulating layer, a product of a reciprocal of a layer thickness and a heat conductivity of the insulating layer is smaller than $4 \times 10^8$ $W/(m^2K)$.

BRIEF DESCRIPTION OF THE DRAWINGS

The present invention will become readily understood from the following description of preferred embodiments thereof made with reference to the accompanying drawings, in which like parts are designated by like reference numerals and in which.

DETAILED DESCRIPTION OF PREFERRED EMBODIMENTS

Semiconductor laser devices according to the embodiments of the present invention will be described below with reference to the accompanying drawings.

Figure 1:
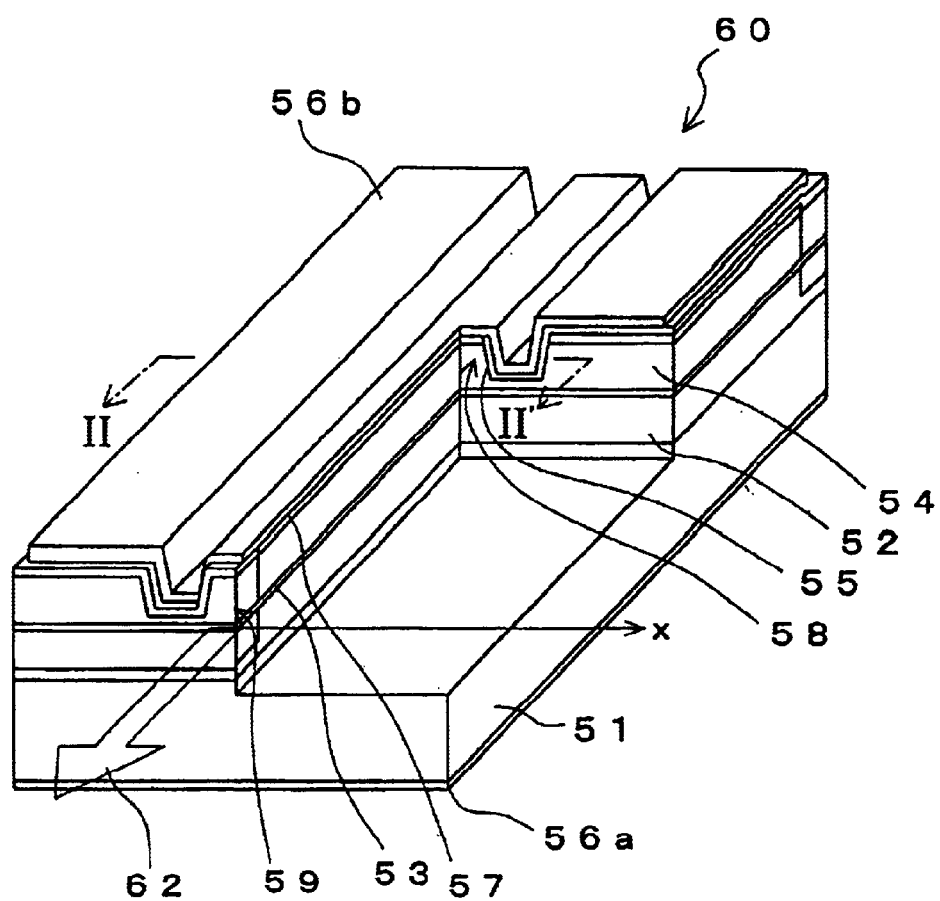
FIG. 1 is a perspective view of a conventional semiconductor laser device.
Figure 2:
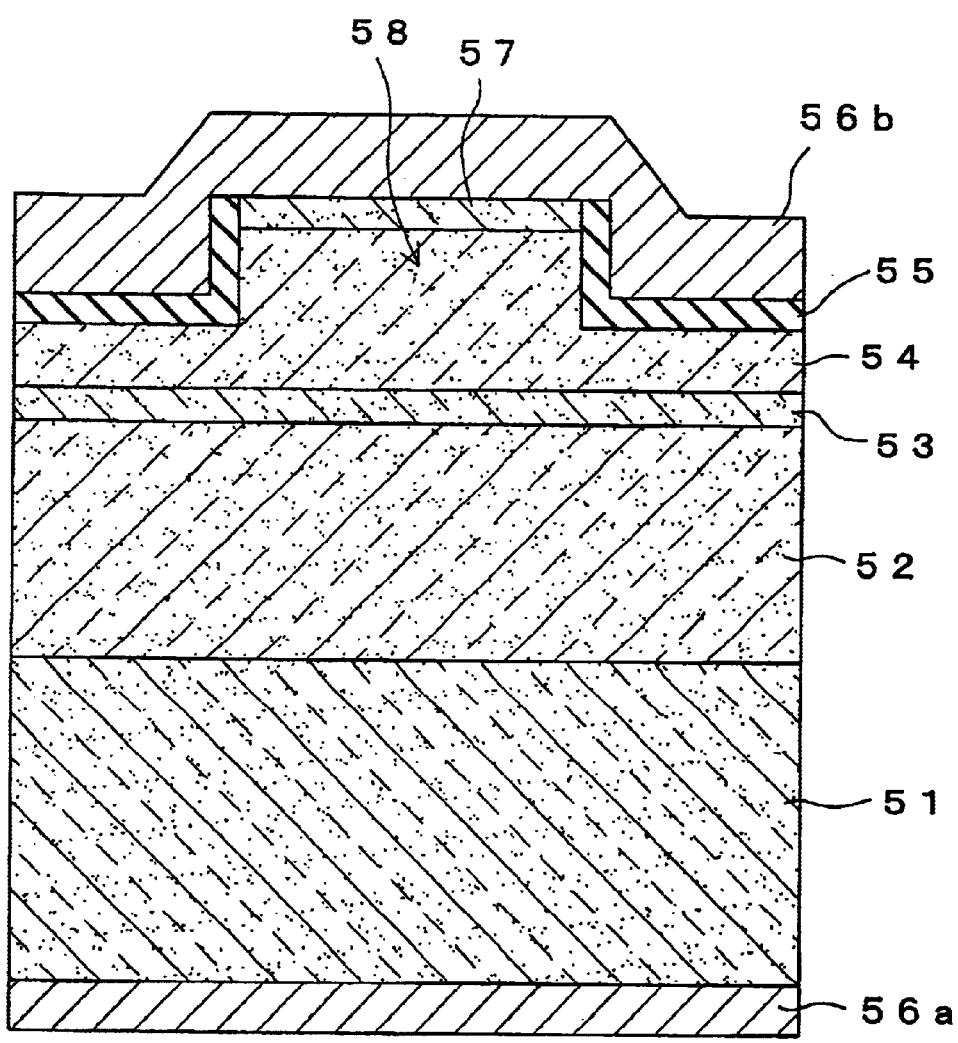
FIG. 2 is a sectional view of a ridge portion at the center along line II—II in FIG. 1.
Figure 3:
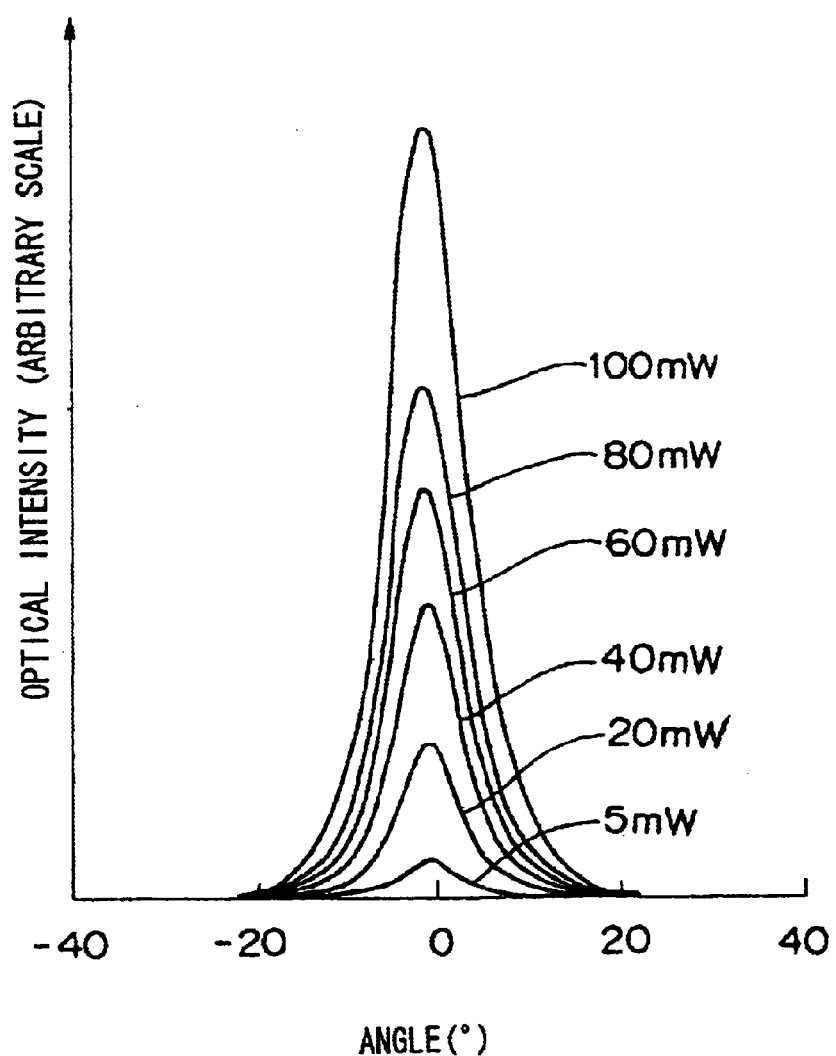
FIG. 3 is a graph of optical output dependency of a far field pattern on x-axis in a conventional semiconductor laser device.
Figure 4:
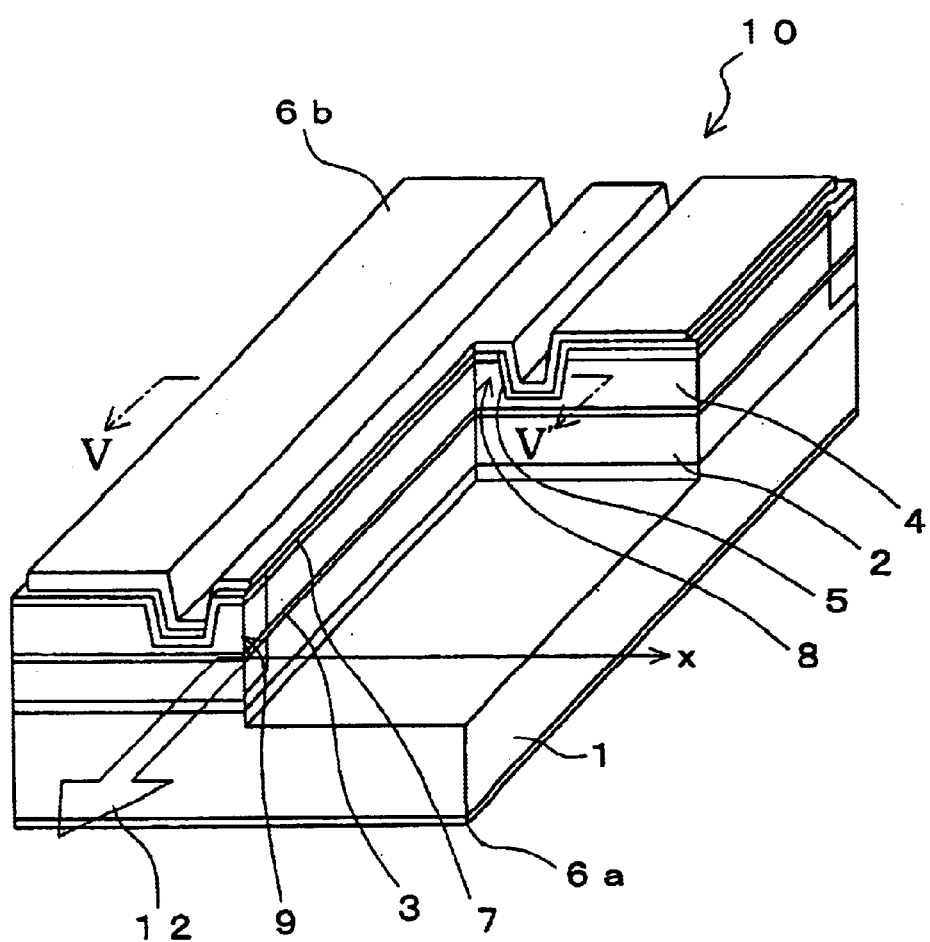
FIG. 4 is a perspective view of a semiconductor laser device according to the first embodiment of the present invention with a partial sectional view thereof.
Figure 5:
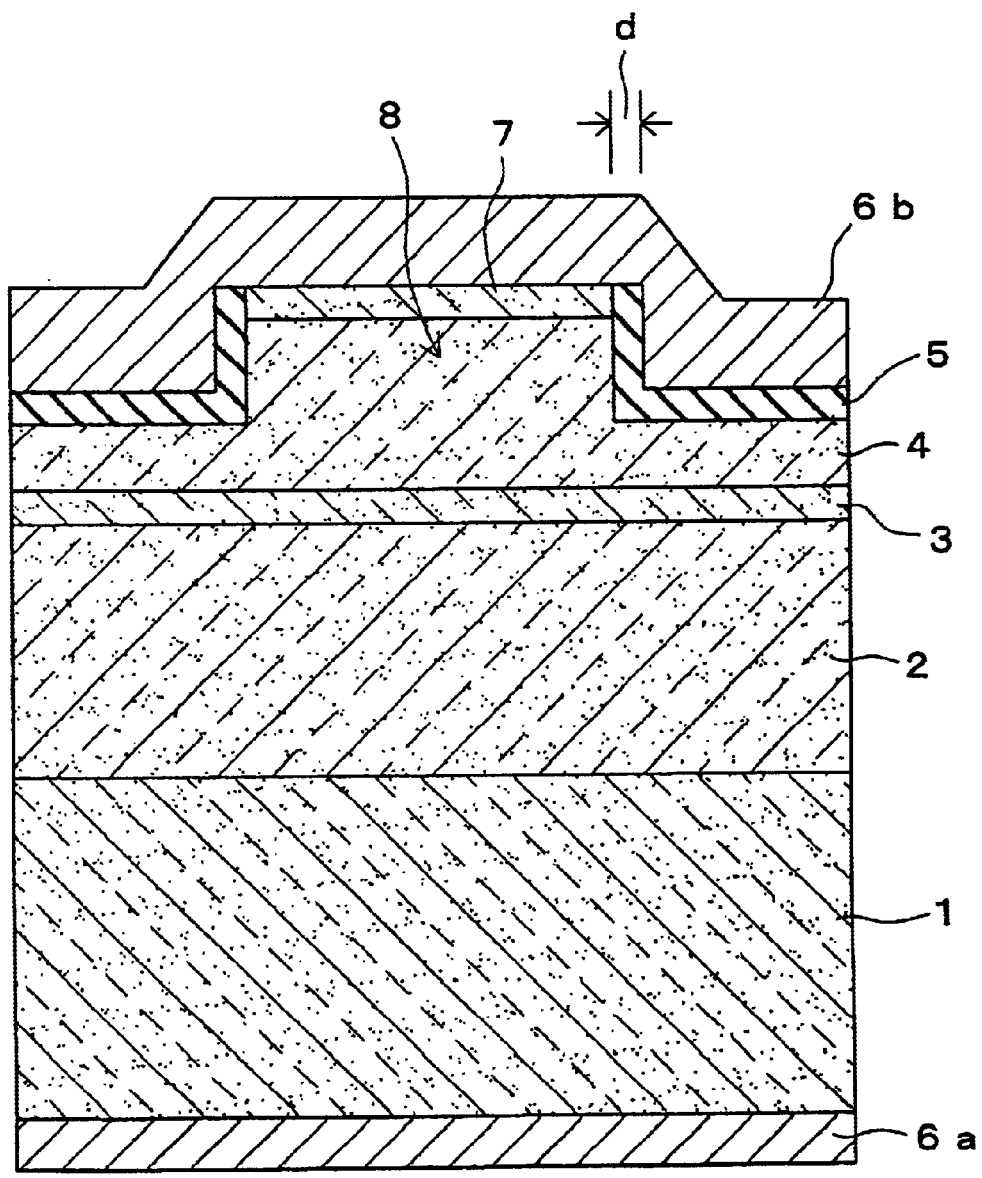
FIG. 5 is a sectional view of a ridge portion at the center along line V—V in FIG. 4.

A semiconductor laser device according to the first embodiment of the present invention will be described below with reference to FIGS. 4 and 5. FIG. 4 is a perspective view of the semiconductor laser device 10 with partially cutaway view, and FIG. 5 is a sectional view along line V—V in FIG. 4 in a direction perpendicular to laser output direction 12. FIG. 5 is an enlarged view of a portion near a projection portion 8 to be described later. This semiconductor laser device 10, as shown in FIGS. 4 and 5, has a stacked structure including a first electrode 6a, a substrate 1 of first conduction type, a first cladding layer 2 of the first conduction type, an active layer 3, a second cladding layer 4 of second conduction type opposite to the first one, an insulating layer 5, and a second electrode 6b. The second cladding layer 4 of second conduction type opposite to the first one has first and second portions having thickness different from each other. The first portion is thicker than the second portion, then the first portion is referred to as projection portion 8 having trapezoidal cross section. The insulating layer 5 covers the second cladding layer 4 except for the first portion 8. The second electrode 6b is electrically connected to the first portion of the second cladding layer 4. The substrate 1 of the first conduction type is an n-type GaAs substrate 1. The first cladding layer 2 of the first conduction type is an n-type AlGaInP cladding layer. The active layer 3 has multiple quantum wells (MQW) structure. The second cladding layer 4 is a p-type AlGaInP cladding layer. The second cladding layer 4 has first and second portions having thickness different from each other. The first portion is thicker than the second portion, and the first portion is sandwiched between second portions. The first portion is also referred to as projection portion 8. A p-type GaAs contact layer 7 is deposited at the top of the projection portion 8 to be connected to the second electrode 6b. The insulating layer 5 is deposited to cover the second cladding layer 4 except for the first portion. Therefore, the second electrode 6b is electrically connected to the second cladding layer 4 through the p-type GaAs contact layer 7. It is to be noted that the above-mentioned structure is called as stripe structure. As described above, current is injected into only the top of the projection portion 8 in the stripe structure, so that light confinement within the active layer in the width direction may be realized. In the insulating layer 5, a product of the reciprocal of layer thickness d and heat conductivity is smaller than $4 \times 10^8$ W/(m$^2$K). The first and second electrodes 6a and 6b are made of a metal such as AuGe/Ni/Au and Ti/Pt, respectively.

As shown in FIG. 4, a window region 9 is provided on each facet of the semiconductor laser device 10. Zinc (Zn) is diffused near the facet of the semiconductor laser device to disorder the active layer 3 having the multiple quantum wells (MQW) structure, to provide this window region 9.

In the semiconductor laser device, the product of the reciprocal of the layer thickness d of the insulating layer 5 and the heat conductivity may be smaller than $4 \times 10^8$ W/(m$^2$K). More specifically, the product of the reciprocal of the layer thickness d of the insulating layer 5 and the heat conductivity is set to $5 \times 10^5$ W/(m$^2$K). Therefore, even though optical output is changed, $\Delta$FFPx can be suppressed.

Next, it is explained how the $\Delta$FFPx is suppressed when optical output is changed in the semiconductor laser device. When optical output is changed, reason why FFPx is changed is initially examined. The semiconductor laser device has a ridge structure having the projection portion 8 in the second cladding layer 4, so that the device can emit a laser beam on fundamental lateral mode oscillation. The width of the projection portion is about ±1.3 μm with reference to the center of the projection portion. The FFPx is substantially determined by refractive index distribution within the range of about 5 μm in x-axis direction (shown as an arrow x in FIG. 4) from the center of the projection portion 8. In this case, the shape of the refractive index distribution itself affects the FFPx. In addition, difference ($\Delta$n) between refractive indices inside and outside the stripe projection portion 8, i.e., both the sides of the projection portion 8 contribute to confinement of generated laser beam 12 in the direction of width and considerably affects the FFPx. In this case, the stripe projection portion 8 has descending edge of the second cladding layer 4 on each side thereof. The both sides of the projection portion 8 means the regions that extend from each descending edge in the perpendicular direction across the second cladding layer 4, the active layer 3, and the first cladding layer 2. In a range in which a higher-order mode cutoff condition is satisfied, the FFPx is increased as $\Delta$n is increased. In general, the refractive index of a semiconductor is increased with an increase in temperature. Therefore, the inventors have considered, when a difference between temperatures inside and outside the projection portion 8, i.e., both the sides of the stripe projection portion 8, that is, temperature gradient increases, difference between refractive indexes will be increased, so the FFPx will be increased.

Figure 6:
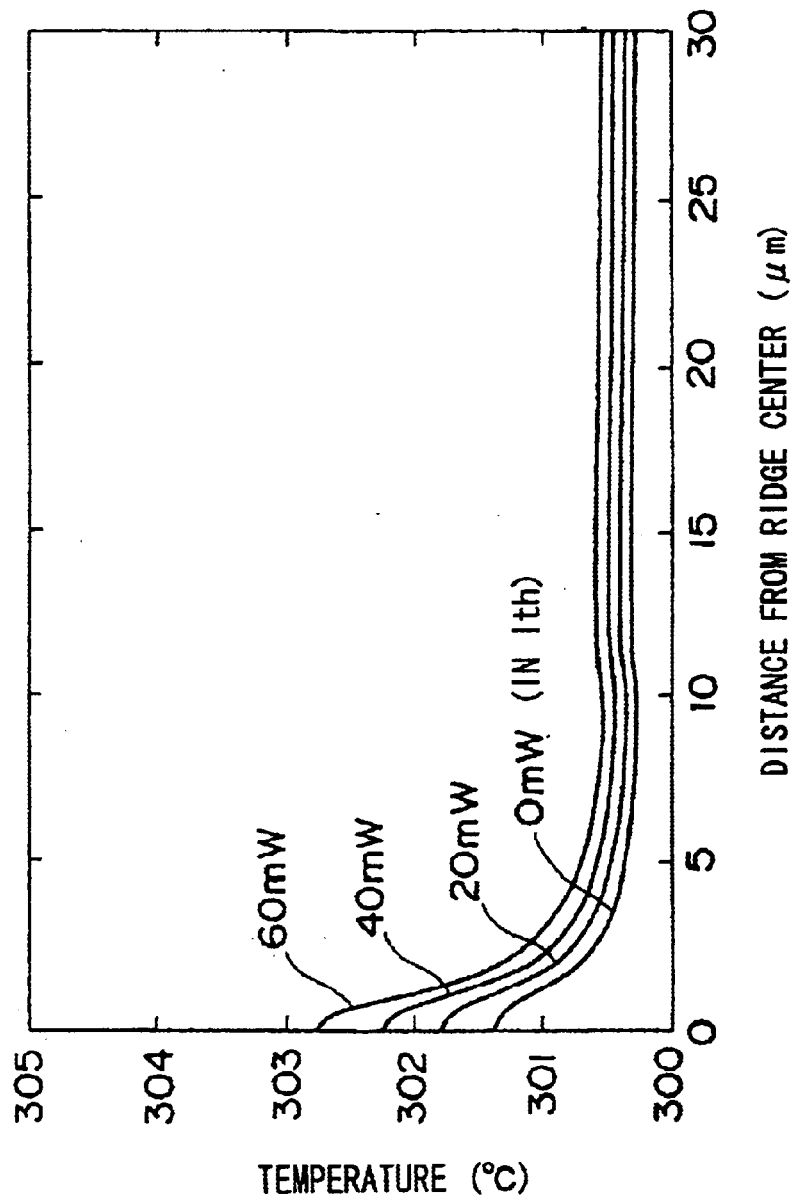
FIG. 6 is a graph of temperature gradient of an active layer of a semiconductor laser device serving as a reference in a direction (x-axis direction) parallel to the layer.

As a example, it is explained a semiconductor laser device using a silicon nitride (SiN) layer having a layer thickness of 100 nm as an insulating layer. The heat conductivity of the silicon nitride (SiN) layer using as the insulating layer is relatively large, i.e., about 40 W/(m·K). Therefore, when laser beam is emitted from the semiconductor laser device, heat generated at a projection portion of a second cladding layer is efficiently transmitted to the outside (for example, a second electrode) through the insulating layer. FIG. 6 is a graph of a calculation result of a temperature profile of an active layer 3 in a direction perpendicular to a laser output direction and parallel to the layer in an operation of a conventional semiconductor laser device. In FIG. 6, the origin of x-axis corresponds to the center of the active layer 3 in FIG. 4. It is to be noted that the optical output of 0 mW means a case in which oscillation threshold current $I_{th}$ is supplied. When the optical output is changed, temperature difference between inside and outside the projection portion, i.e., on the both sides of the stripe projection portion is increased, that is, large temperature gradient is generated. In the semiconductor laser device of this reference, a difference (hereinafter referred to as $\Delta$T) between a temperature at the center of the projection portion 8 (ridge portion) at optical output of 0 mW and temperature at a position distant from the center by 5 μm in the x-axis direction is 1.0° C. The temperature gradient at the boundary between inside and outside of the projection portion 8 is 0.5° C./μm at optical output of 0 mW and is 1.5° C./μm at optical output of 60 mW. The projection portion 8 may have about 1.5 to 5 μm in the x-axis direction. The boundary is located on each side of the stripe projection portion 8. That is, the temperature gradient considerably changes. Therefore, when the optical output is increased, the temperature is increased, the temperature gradient is increased, and a refractive index difference (hereinafter referred to as $\Delta$n) of both the sides of the projection portion 8 is increased. Therefore, since near field pattern (NFP) decreases, far field pattern (FFPx) is increased.

Figure 7:
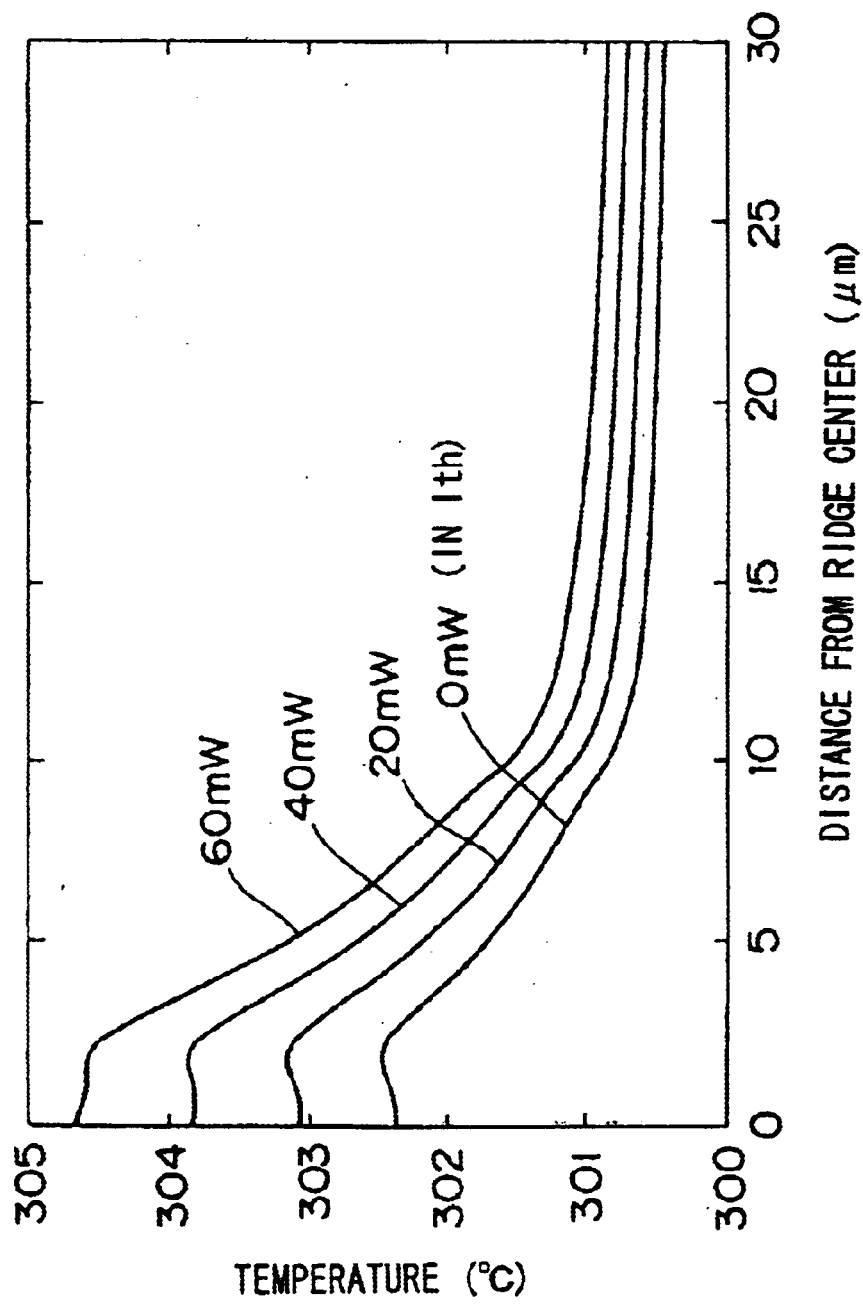
FIG. 7 is a graph of temperature gradient of an active layer in the semiconductor laser device according to the first embodiment of the present invention in a direction (x-axis direction) parallel to the layer.

FIG. 7 is a graph of a calculation result of a temperature profile of the active layer 3 in a direction which is perpendicular to an output direction of a laser beam and parallel to the layer in an operation of the semiconductor laser device. As shown in FIG. 7, in this semiconductor laser device 10, a temperature difference $\Delta$T is 0.6° C. at optical output of 0 mW, and temperature difference $\Delta$T is 1.3° C. at optical output of 60 mW, so that the difference therebetween is small, i.e., 0.7° C. Therefore, in the operation of the semiconductor laser device, heat generated near the projection portion 8 may be held in the active layer 3. As a result, as shown in FIG. 7, the temperature gradient on the both sides of the stripe projection portion 8 decreases. It is noted that the stripe projection portion may have a width of from 1.5

μm to 5 μm as shown in FIG. 7. In addition, the temperature gradient is 0.3° C./μm at an optical output of 0 mW, and is 0.4° C./μm at an optical output of 60 mW. Then, even though optical output is changed, the temperature gradient on the both sides of the stripe projection portion 8 will be changed within narrow limits. Therefore, even though an optical output is changed, the refractive index difference (Δn) at the boundary between inside and outside the projection portion 8 is not largely changed, and NFP is not largely changed. The projection portion 8 acts as the light confinement of the laser beam 12 within the active layer 3 in the lateral direction. Therefore, even though the optical output is changed, FFPx of a semiconductor laser device will be changed within narrow limits. According to the calculation, ΔFFPx can be reduced to about ⅓ of ΔFFPx in the reference semiconductor laser device.

A process of fabricating the semiconductor laser device will be described below. This semiconductor laser device is fabricated by the following steps.

(a) An n-type GaAs substrate 1 is provided.

(b) An n-type AlGaInP cladding layer 2 is deposited on the n-type GaAs substrate 1.

(c) An active layer 3 having multiple quantum wells structure MQW is deposited on the n-type AlGaInP cladding layer 2.

(d) A p-type AlGaInP cladding layer 4 and a p-type GaAs contact layer 7 are deposited on the active layer 3.

(e) The p-type AlGaInP cladding layer 4 and the p-type GaAs contact layer 7 are partially removed by etching to form a stripe projection portion 8.

(f) An insulating layer 5, in which a product of the reciprocal of the film thickness and the heat conductivity is smaller than $4 \times 10^8$ W/(m$^2$·K), is deposited on the both sides of the projection portion 8.

(g) The insulating layer 5 is partially removed at the top of the projection portion 8.

(h) A second electrode 6b connected to the p-type GaAs contact layer 7 at the top of the projection portion 8 is formed.

(i) A first electrode 6a is formed on another surface of the n-type GaAs substrate 1.

The semiconductor laser device is fabricated by the above steps.

A semiconductor laser device according to the second embodiment of the present invention will be described below. This semiconductor laser device is different from the semiconductor laser device according to the first embodiment in that the insulating layer 5 is silicon oxide (i.e., SiOx) layer having a layer thickness of 100 nm. Since the SiOx layer has a heat conductivity of about 1 W/(m·K), the product of the reciprocal of the layer thickness of the insulating layer 5 and the heat conductivity is $1 \times 10^7$ W/(m$^2$K). Then, the product can be sufficiently smaller than the value of $4 \times 10^8$ W/(m$^2$K) in the conventional technique. As a result, a temperature gradient on each side of the projection portion 8 decreases, and the temperature gradient can hardly be changed, when optical output is changed. Therefore, even though the optical output is changed, the refractive index difference (Δn) acting as light confinement of laser within the active layer 3 in the lateral direction is not largely changed, and near field pattern NFP is not largely changed. It is noted that the Δn is the refractive index difference between inside and outside at the boundary of the projection portion 8. Therefore, even though the optical output is changed, FFPx of a semiconductor laser device will be changed within narrow limits. For example, the change of ΔFFPx will be about ⅓ ΔFFPx in the reference.

A semiconductor laser device according to the third embodiment of the present invention will be described below. The semiconductor laser device is different from the semiconductor laser device according to the first embodiment in that the insulating layer 5 is a polyimide resin film having a layer thickness of 100 nm. Since the heat conductivity of the polyimide resin is about 2 W/(m·K), the product of the reciprocal of the layer thickness of the insulating layer 5 and the heat conductivity is $2 \times 10^7$ W/(m$^2$K). That is, the product can be sufficiently smaller than the value of $4 \times 10^8$ W/(m$^2$K) in the conventional technique. As a result, a temperature gradient on each side of the projection portion 8 decreases, and the temperature gradient can be hardly changed, when optical output is changed. Therefore, even though the optical output is changed, the refractive index difference (Δn) acting as light confinement of laser within the active layer 3 in the lateral direction is not largely changed, and NFP is not largely changed. Therefore, even though the optical output is changed, FFPx of a semiconductor laser device is changed within narrow limits.

A semiconductor laser device according to the fourth embodiment of the present invention will be described below. This semiconductor laser device is different from the semiconductor laser device according to the first embodiment in that the insulating layer 5 is a benzo-cyclo buthene resin (BCB resin) layer having a layer thickness of 100 nm. Since the heat conductivity of the benzo-cyclo buthene resin is about 2 W/(m·K), the product of the reciprocal of the layer thickness of the insulating layer 5 and the heat conductivity is $2 \times 10^7$ W/(m$^2$K). That is, the product can be sufficiently smaller than the value of $4 \times 10^8$ W/(m$^2$K) in the conventional technique. As a result, a temperature gradient on each side of the stripe projection portion 8 decreases, and the temperature gradient can be hardly changed, when optical output is changed. Therefore, even though the optical output is changed, the refractive index difference (Δn) acting as light confinement of laser within the active layer 3 in the lateral direction is not largely changed, and NFP is not largely changed. Therefore, even though the optical output is changed, FFPx of a semiconductor laser device can be changed within narrow limits.

A semiconductor laser device according to the fifth embodiment of the present invention will be described below. This semiconductor laser device is different from the semiconductor laser device according to the first embodiment in that the insulating layer 5 is a phosphorous glass layer having a layer thickness of 100 nm and formed by spin coating. Since the heat conductivity of the phosphorous glass is about 1 W/(m·K), the product of the reciprocal of the layer thickness of the insulating layer 5 and the heat conductivity is $1 \times 10^7$ W/(m$^2$K). That is, the product may be sufficiently smaller than the value of $4 \times 10^8$ W/(m$^2$K) in the conventional technique. As a result, a temperature gradient on each side of the stripe projection portion 8 decreases, and the temperature gradient can be hardly changed, when optical output is changed. Therefore, even though the optical output is changed, the refractive index difference (Δn) acting as light confinement of laser within the active layer 3 in the lateral direction is not largely changed, and NFP is not largely changed. Therefore, even though the optical output is changed, FFPx of a semiconductor laser device will be changed within narrow limits.

A semiconductor laser device according to the sixth embodiment of the present invention will be described below. This semiconductor laser device is different from the semiconductor laser device according to the first embodiment in that the insulating layer 5 is a silicon nitride (SiN) layer having a layer thickness of 500 nm. The heat conductivity of the silicon nitride (SiN) layer is about 40 W/(m·K). However, since the layer thickness is set to large, i.e., 500 nm, the product of the reciprocal of the layer thickness of the insulating layer 5 and the heat conductivity is $8 \times 10^7$ W/(m$^2$K). That is, the product may be sufficiently smaller than the value of $4 \times 10^8$ W/(m$^2$K) in the conventional technique. As a result, a temperature gradient on each side of the stripe projection portion 8 decreases, and the temperature gradient can be hardly changed, when optical output is changed. Therefore, even though the optical output is changed, the refractive index difference ($\Delta$n) acting as light confinement of laser within the active layer 3 in the lateral direction is not largely changed, and NFP is not largely changed. Therefore, even though the optical output is changed, FFPx of a semiconductor laser device will be changed within narrow limits.

Figure 8:
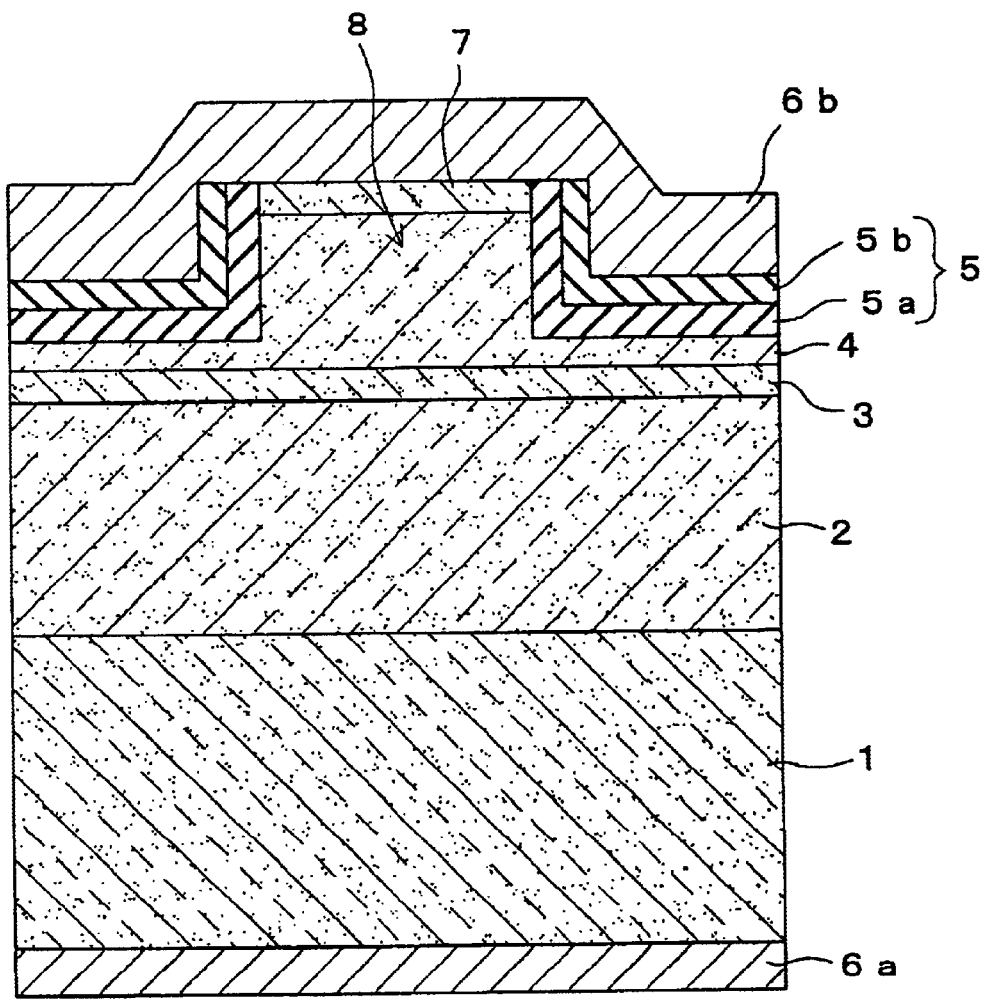
FIG. 8 is a sectional view of a ridge portion at the center of a semiconductor laser device according to the seventh embodiment of the present invention.

A semiconductor laser device according to the seventh embodiment of the present invention will be described below with reference to FIG. 8. This semiconductor laser device is different from the semiconductor laser device according to the first embodiment in that, as shown in FIG. 8, the insulating layer 5 is constituted by a plurality of insulating layer 5a and 5b. More specifically, the plurality of insulating layers includes the silicon nitride (SiN) layer 5a which covers side surfaces of the projection portion 8 of the second cladding layer 4, which has a layer thickness of 100 nm, and which is deposited by thermal CVD process and the silicon nitride (SiN) layer 5b which has a layer thickness of 400 nm and which is deposited by plasma CVD process. The heat conductivity of the silicon nitride (SiN) layers 5a and 5b are about 40 W/(m·K). However, since the layer thickness is set to large, i.e., 500 nm, the product of the reciprocal of the layer thickness of the insulating layer 5 and the heat conductivity is $8 \times 10^7$ W/(m$^2$K). That is, the product may be sufficiently smaller than the value of $4 \times 10^8$ W/(m$^2$K) in the conventional technique. As a result, a temperature gradient on each side of the projection portion 8 decreases, and the temperature gradient can be hardly changed, when optical output is changed. Therefore, even though the optical output is increased, the refractive index difference ($\Delta$n) on each side of the stripe projection portion 8 acting as light confinement of laser beam 12 within the active layer 3 in the lateral direction is not largely changed, and NFP is not largely changed. Therefore, even though the optical output is changed, FFPx of a semiconductor laser device is changed within narrow limits. According to calculation, even though the optical output is changed, $\Delta$FFPx can be reduced to about ⅓ $\Delta$FFPx of the reference semiconductor laser device.

A process of fabricating the semiconductor laser device will be described below. The semiconductor laser device 10 is fabricated by the following steps.

(a) An n-type GaAs substrate 1 is provided.

(b) An n-type AlGaInP first cladding layer 2 is deposited on the n-type GaAs substrate.

(c) An active layer 3 having multiple quantum wells structure is deposited on the n-type AlGaInP cladding layer 2.

(d) A p-type AlGaInP cladding layer 4 and a p-type GaAs contact layer 7 are formed on the active layer 3 having the multiple quantum wells structure.

(e) The p-type AlGaInP cladding layer 4 and the p-type GaAs contact layer 7 are partially removed by etching to form a stripe projection portion 8.

(f) A silicon nitride (SiN) layer 5a having a layer thickness of 100 nm is deposited on side surfaces of the projection portion 8 by thermal CVD process.

(g) A silicon nitride (SiN) layer 5b having a layer thickness of 400 nm is deposited on the silicon nitride layer 5a by plasma CVD process.

(h) The silicon nitride layers 5a and 5b are partially removed at the top of the projection portion 8.

(i) A second electrode 6b connected to the second cladding layer 4 through the p-type GaAs contact layer 7 is deposited at the top of the projection portion 8.

(j) A first electrode 6a is formed on another surface of the n-type GaAs substrate 1.

In the steps in fabricating a semiconductor laser device, the insulating layer 5 is constituted such that two layers are stacked. The silicon nitride layer 5a serving as the first layer is deposited by thermal CVD process which has good coverage but high film depositing temperature of about 700° C. The silicon nitride layer 5b serving as the second layer is deposited by plasma CVD process which has poor coverage and low film depositing temperature of about 300° C. In general thermal CVD process, when a layer thickness exceeds about 150 nm, film peeling frequently occurs due to thermal stress. Therefore, a layer having a thickness of 150 nm or more can be hardly deposited. In the fabricating steps, the silicon nitride layer 5a having a layer thickness of about 100 nm is deposited by the thermal CVD process to achieve good coverage. Thereafter, a thick film having a layer thickness of 400 nm can be deposited by the plasma CVD process. Therefore, a semiconductor laser device which suppresses thermal stress acting on the insulating layer 5 and which is free from film peeling in processes can be obtained.

A semiconductor laser device according to the eighth embodiment of the present invention will be described below. This semiconductor laser device is different from the semiconductor laser device according to the seventh embodiment in that the second layer 5b of the insulating layer is a silicon nitride (SiN) layer having a layer thickness of 400 nm and deposited by sputtering. More specifically, the insulating layer 5 is constituted by the silicon nitride (SiN) layer 5a deposited by thermal CVD process which has good coverage but high film depositing temperature of about 700° C. and the silicon nitride layer 5b deposited by sputtering process having poor coverage and low depositing temperature, e.g. room temperature. A semiconductor laser device can reduce thermal stress acting on the insulating layer 5, and is free from film peeling in processes. In the thermal CVD process, in general, a thick film having a layer thickness of 150 or more can be hardly deposited because film peeling frequently occurs due to thermal stress.

A semiconductor laser device according to the ninth embodiment of the present invention will be described below. This semiconductor laser device is different from the semiconductor laser device according to the seventh embodiment in that the second layer of the insulating layer is SiO layer having a layer thickness of 100 nm. Since heat conductivity of SiO is about 1 W/(m·K), a product B of the reciprocal of the layer thickness of the second layer 5b and the heat conductivity is $1 \times 10^7$ W/(m$^2$K). On the other hand, a product A of the reciprocal of the layer thickness of the first layer 5a and the heat conductivity is $4 \times 10^8$ W/(m$^2$K). The product of the reciprocal of the layer thickness of the insulating layer 5 formed by the first layer 5a and the second layer 5b and the heat conductivity of the insulating layer 5 is expressed as (A×B)/(A+B) by using the A and B. The value of (A×B)/(A+B) is given by $9.8 \times 10^6$ W/(m$^2$K). That is, the value may be sufficiently smaller than the value of $4 \times 10^8$ W/(m²K) in the conventional technique. As a result, a temperature gradient on each side of the stripe projection portion 8 can be reduced, and the temperature gradient can be hardly changed even though optical output is changed. Therefore, even though the optical output is increased, the refractive index difference (Δn) acting as light confinement of laser beam 12 within the active layer 3 in the lateral direction is not largely changed, and NFP is not largely changed. Therefore, even though the optical output is changed, FFPx of a semiconductor laser device will be changed within narrow limits.

A semiconductor laser device according to the tenth embodiment of the present invention will be described below. This semiconductor laser device is different from the semiconductor laser device according to the seventh embodiment in that the second layer of the insulating layer is silicon nitride/oxide layer (SiON layer: nitrogen content of 20%) having a layer thickness of 100 nm and deposited by plasma CVD process. Although the heat conductivity of the SiON layer varies depending on a nitrogen content, when the nitrogen content is 20% or less, the heat conductivity is about 1 W/(m·K) which is almost equal to that of SiO layer. A product B of the reciprocal of the layer thickness of the second layer 5b and the heat conductivity is $10^7$ W/(m²K), and a product A of the reciprocal of the layer thickness of the first layer 5a and the heat conductivity is $4 \times 10^8$ W/(m²·K). The product of the reciprocal of the layer thickness of the insulating layer 5 formed by the first layer 5a and the second layer 5b and the heat conductivity of the insulating layer 5 is expressed as (A×B)/(A+B) by using the A and B. The value of (A×B)/(A+B) is given by $9.8 \times 10^6$ W/(m²K). That is, the value may be sufficiently smaller than the value of $4 \times 10^8$ W/(m²K) in the conventional technique. As a result, a temperature gradient on each side of the stripe projection portion 8 decreases, and the temperature gradient can be hardly changed, when optical output is changed. Therefore, even though the optical output is increased, the refractive index difference (Δn) acting as light confinement of laser beam within the active layer 3 in the lateral direction is not largely changed, and NFP is not largely changed. Therefore, even though the optical output is changed, FFPx of a semiconductor laser device will be changed within narrow limits.

The insulating layer 5 is constituted by the silicon nitride (SiN) layer 5a and the SiON layer 5b. The silicon nitride (SiN) layer 5a is deposited by thermal CVD process having good coverage but high film depositing temperature of about 700° C. The SiON layer 5b is deposited by plasma CVD process having poor coverage and low film depositing temperature of about 300° C. A semiconductor laser device can reduce thermal stress acting on the insulating layer 5 and is free from film peeling in processes.

A semiconductor laser device according to the eleventh embodiment of the present invention will be described below. This semiconductor laser device is different from the semiconductor laser device according to the tenth embodiment in that the second layer of the insulating layer is silicon nitride/oxide layer (SiON layer: nitrogen content of 20%) having a layer thickness of 100 nm and deposited by sputtering. More specifically, the insulating layer 5 is constituted by the silicon nitride (SiN) layer 5a and the SiON layer 5b. The silicon nitride (SiN) layer 5a is deposited by thermal CVD process having good coverage but high film depositing temperature of about 700° C. The SiON layer 5b is deposited by sputtering having poor coverage and low film depositing temperature of about room temperature. Therefore, a semiconductor laser device can reduce thermal stress acting on the insulating layer 5 and is free from film peeling in processes.

Figure 9:
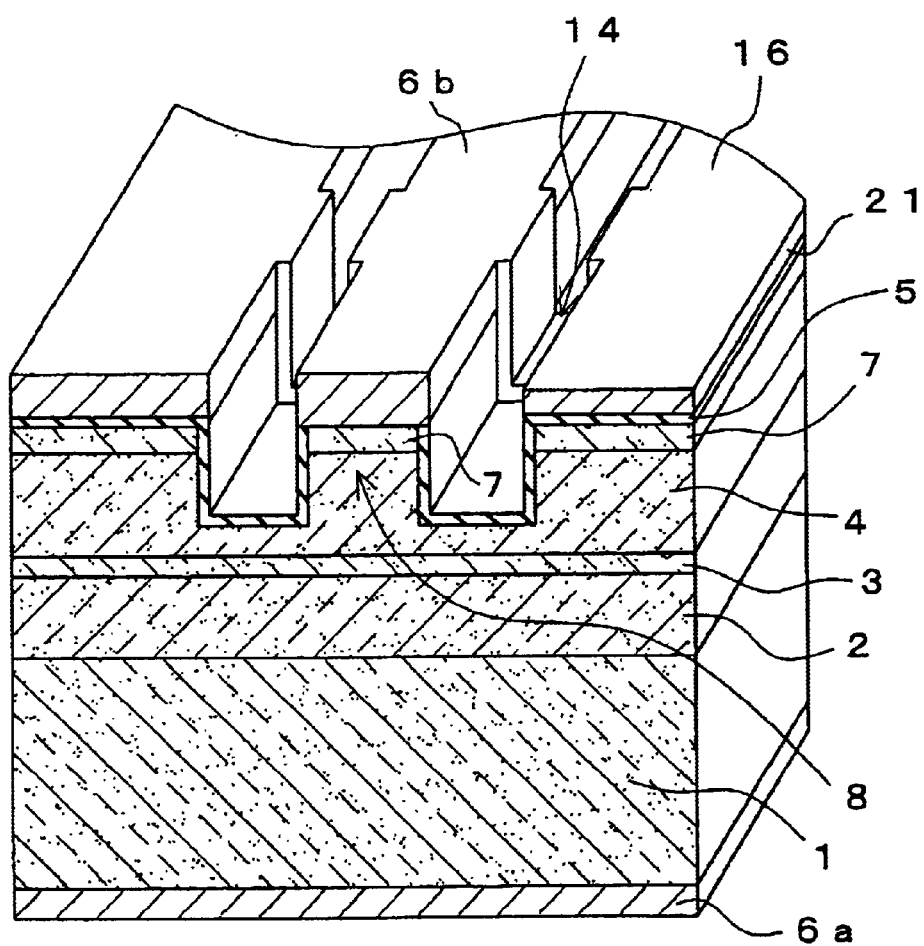
FIG. 9 is a perspective sectional view of the structure of a ridge portion at the center of the semiconductor laser device according to the twelfth embodiment of the present invention.

A semiconductor laser device according to the twelfth embodiment of the present invention will be described below with reference to FIG. 9. This semiconductor laser device is different from the semiconductor laser device according to the first embodiment in that, as shown in FIG. 9, the second electrode 6b is formed at only the top of the projection portion 8 of the second cladding layer 4. Furthermore, these devices are also different in that a bridge portion 14 is formed between the second electrode 6b and a bonding pad 16. Since the second electrode 6b is formed at only the top of the projection portion 8 as described above, heat conduction from the projection portion 8 to the outside through the insulating layer 5 is suppressed, and temperature gradient can be hardly changed, when optical output is changed. Therefore, even though the optical output is increased, a refractive index difference (Δn) on each side of the stripe projection portion 8 is not largely changed, and NFP is not largely changed. Therefore, even though the optical output is changed, the FFPx of a semiconductor laser device will be changed within narrow limits.

In this semiconductor laser device, an operation obtained when the second electrode 6b is formed at only the top of the projection portion 8 will be described below with reference to FIG. 9. In an operation of the semiconductor laser device 10, heat generated near the projection portion 8 is transmitted from the p-type GaAs contact layer 7 or the insulating layer 5 to the outside through the second electrode 6b. On the other hand, since the second electrode 6b is formed at a limited portion, so that heat is relatively moderately diffused from the projection portion 8 to the outside. As a result, a temperature gradient on each side of the stripe projection portion 8 decreases. Even though optical output is changed, the temperature gradient is not largely changed.

In the semiconductor laser device, the bonding pad 16 is arranged on the upper surface to be connected to an external electrode (not shown). The bonding pad 16 is connected to the second electrode 6b by the bridge portion 14. In this manner, excessive heat does not reach the projection portion 8 in connection to the external electrode. This bridge portion 14 is formed simultaneously with the second electrode 6b. The bridge portion 14 is not limited to the structure illustrated in FIG. 9, for example, the bridge portion may have a bridge structure which spatially connects the second electrode 6b to the bonding pad 16.

In the semiconductor laser device according to an aspect of the present invention, the product of the reciprocal of the layer thickness of the insulating layer which covers the second cladding layer except for a step portion having a relatively thick layer and heat conductivity of the insulating layer is smaller than $4 \times 10^8$ W/(m²K). Therefore, in the operation of the semiconductor laser device, heat generated near the projection portion is held in the active layer. The projection portion has a step portion having the relatively large thickness of the second cladding layer as a top. As a result, even though optical output is changed, the temperature gradient at the boundary between the inside and outside of the projection portion may be suppressed. The boundary is located on each side of the stripe projection portion. The refractive index difference (Δn) on each side of the stripe projection portion acts as light confinement of the laser beam within the active layer in the lateral direction. Therefore, even though the optical output is changed, the refractive index difference (Δn) is not largely changed, and NFP is not largely changed. Then, FFPx of a semiconductor laser device will be changed within narrow limits. For example, ΔFFPx may be about ⅓ ΔFFPx in the reference.

In the semiconductor laser device according to another aspect of the present invention, the product of the reciprocal of the layer thickness of the insulating layer and heat conductivity is smaller than $8 \times 10^7$ W/(m$^2$K). As a result, a temperature gradient at the boundary between inside and outside of the projection portion is hardly changed. It is noted that the boundary is located on each side of the stripe projection portion. Therefore, even though the optical output is changed, FFPx of a semiconductor laser device will be changed within narrow limits.

In the process of fabricating a semiconductor laser device according to an aspect of the present invention, the process includes two depositing steps that deposits the first and second insulating layer. The first insulating layer including a silicon nitride layer is deposited by thermal chemical vapor deposition process on the second cladding layer except for a step portion having a relatively thick layer, and the second insulating layer is deposited on the first insulating layer. Therefore, the first insulating layer having good coverage can be deposited. It is noted that the thermal chemical vapor deposition process has high film depositing temperature. When the insulating layer is constituted by plurality of insulating layers, so that the semiconductor laser device which suppresses thermal stress acting on the insulating layer and which is free from film peeling in processes.

Although the present invention has been described in connection with the preferred embodiments thereof with reference to the accompanying drawings, it is to be noted that various changes and modifications are apparent to those skilled in the art. Such changes and modifications are to be understood as included within the scope of the present invention as defined by the appended claims, unless they depart therefrom.

What is claimed is:

1. A semiconductor laser device comprising:

a first electrode;

a substrate having a first conductivity type, disposed on said first electrode;

a first cladding layer of the first conductivity type on said substrate;

an active layer on said first cladding layer;

a second cladding layer having a second conductivity type, opposite the first conductivity type, on said active layer, wherein a first portion of said second cladding layer is thicker than second portions of said second cladding layer, the first portion of said second cladding layer being disposed between two of the second portions of said second cladding;

an insulating layer covering the second portions of said second cladding layer, but not the first portion of said second cladding layer, wherein said insulating layer has a thickness on the second portions of said second cladding layer, and a heat conductivity, and the product of the reciprocal of the thickness of said insulating layer and the heat conductivity of said insulating layer is smaller than $4 \times 10^8$ W/(m$^2$K); and a second electrode, electrically connected to the first portion of said second cladding layer, disposed partially on said insulating layer.

2. The semiconductor laser device according to claim 1, wherein, in said insulating layer, the product is no larger than $8 \times 10^7$ W/(m$^2$K).

3. The semiconductor laser device according to claim 1, wherein said insulating layer is a material having a heat conductivity not higher than 5 W/(m·K).

4. The semiconductor laser device according to claim 1, wherein said insulating layer comprises a silicon nitride layer having thickness larger than 100 nm.

5. The semiconductor laser device according to claim 1, wherein said insulating layer comprises a plurality of stacked insulating films.

6. The semiconductor laser device according to claim 5, wherein said insulating layer comprises:

a first film comprising a silicon nitride film deposited on the second portions of said second cladding layer, but not on the first portion of said second cladding layer, wherein the product of the reciprocal of the thickness of said silicon nitride film and the heat conductivity of said silicon nitride film has a value equal to A; and a second film disposed on the silicon nitride film, wherein the product of the reciprocal of the thickness of the second film and the heat conductivity of the second film has a value equal to B, and $(A \times B)/(A+B)$ is smaller than $4 \times 10^8$ W/(m$^2$K).

* * * * *